United States Patent
Oowaki et al.

(10) Patent No.: US 7,303,965 B2
(45) Date of Patent: Dec. 4, 2007

(54) MIS TRANSISTOR AND METHOD FOR PRODUCING SAME

(75) Inventors: Yukihito Oowaki, Yokohama (JP); Mizuki Ono, Yokohama (JP); Mitsuhiro Noguchi, Yokohama (JP); Daisaburo Takashima, Yokohama (JP); Akira Nishiyama, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 09/879,208

(22) Filed: Jun. 13, 2001

(65) Prior Publication Data
US 2001/0030350 A1    Oct. 18, 2001

Related U.S. Application Data

(62) Division of application No. 09/340,149, filed on Jun. 28, 1999, now Pat. No. 6,278,165.

(30) Foreign Application Priority Data
Jun. 29, 1998 (JP) ............................... 10-182899

(51) Int. Cl.
  *H01L 21/33*   (2006.01)
  *H01L 21/3205* (2006.01)
  *H01L 31/00*   (2006.01)
(52) U.S. Cl. ............ 438/300; 438/305; 438/589; 257/410
(58) Field of Classification Search ............ 438/591, 438/595, 588, 270, 197, 300, 305, 589; 257/410
See application file for complete search history.

(56) References Cited

U.S. PATENT DOCUMENTS 5,270,257 A * 12/1993 Shin ........................... 437/203

(Continued)

FOREIGN PATENT DOCUMENTS

JP    07-099310    11/1995
JP    09-116142     2/1997

OTHER PUBLICATIONS

S.M. Sze, "MOSFET Strutures," *Physics of Semiconductor Devices*, 2nd Edition, John Wiley & Son, Inc., pp. 494-495 (1981).

(Continued)

*Primary Examiner*—Howard Weiss
*Assistant Examiner*—Steven H. Rao
(74) *Attorney, Agent, or Firm*—Finnegan, Henderson, Farabow, Garrett & Dunner, L.L.P.

(57) ABSTRACT

In a MIS transistor, the top surfaces of source/drain regions (S/D diffusion layers) formed on a semiconductor substrate 1 are arranged nearer to a gate electrode than a channel plane on the semiconductor substrate, and the top surfaces of the source/drain regions are arranged nearer than the channel plane than the interface between a gate insulator film provided on the upper side of the channel plane and the gate electrode. In this transistor, a groove is selectively formed in the surface of the semiconductor substrate, and a polycrystalline silicon deposited in the groove may be used as a mask to form impurity diffusion layers serving as source/drain regions to laminate and form a gate insulator film of a high dielectric film and a gate electrode. Alternatively, the polycrystalline silicon may be selectively formed to be used as a mask to elevate and form the impurity diffusion layer to laminate and form the gate insulator film and the gate electrode. Thus, it is possible to achieve both of the reduction of the resistance of the S/D diffusion layers and the reduction of the gate parasitic capacitance.

18 Claims, 11 Drawing Sheets

U.S. PATENT DOCUMENTS

| | | | | |
|---|---|---|---|---|
| 5,869,375 | A * | 2/1999 | Choi et al. | 438/300 |
| 5,923,056 | A | 7/1999 | Lee et al. | 257/192 |
| 5,949,116 | A * | 9/1999 | Wen | 257/408 |
| 6,025,635 | A * | 2/2000 | KrivoKapic | 257/412 |
| 6,228,763 | B1 * | 5/2001 | Lee | 438/639 |
| 6,248,622 | B1 * | 6/2001 | Lee | 438/239 |
| 6,297,530 | B1 * | 10/2001 | Akatsu et al. | 257/327 |
| 6,303,448 | B1 * | 10/2001 | Chang et al. | 438/300 |
| 6,316,299 | B1 * | 11/2001 | Tung | 438/197 |
| 2001/0019872 | A1 * | 9/2001 | Havemann | 438/305 |

OTHER PUBLICATIONS

S.M. Sze, "MOSFET Strutures," *Physics of Semiconductor Devices*, 2nd Edition, John Wiley & Son, Inc., pp. 490-491 (1981).

\* cited by examiner

MIS TRANSISTOR AND METHOD FOR PRODUCING SAME

This is a division of application Ser. No. 09/340,149 filed Jun. 28, 1999, which is incorporated herein by reference now U.S. Pat. No. 6,278,165.

BACKGROUND OF THE INVENTION

The present invention relates generally to a MIS transistor and a method for producing the same. More specifically, the invention relates to a MIS transistor having a large driving current and a small parasitic capacitance, and a method for producing the same.

As a request to achieve the scaling down of a transistor having the metal insulator semiconductor (MIS) structure grows more intense, the scaling down of the MIS transistor progresses steadily at present. The scaling down of the MIS transistor is carried out by using a technique called a scaling rule for forming a source/drain region in proportion to a gate length, specifically by reducing the junction depth of an impurity diffusion region, a so-called diffusion layer, which is to be a drain and/or source, as the gate length decreases when the gate length decreases.

However, in a fine transistor having a gate length of less than 0.2 µm, the depth (Xj) of diffusion is too small, so that there is a problem in that the resistance of the gate increase to increase the parasitic resistance of the whole transistor to reduce a substantial driving current. In order to reduce the parasitic resistance, it is possible that the depth of the junction is reduced when the metal silicidation of the source and drain to be introduced is carried out. However, when the reduction of the depth of the junction is too great, there is a problem in that the silicide metal does not remain in the diffusion layer and penetrates the substrate to cause the junction leak.

The problem in that the resistance increases or the silicidation is difficult to carry out when the junction is shallow has been solved by the art called an elevated source/drain, a concave transistor, a recessed channel transistor or the like. This transistor has a structure wherein the surfaces of the source and drain are higher than the channel surface of the transistor (e.g., S. M. Sze Physics of Semiconductor Devices second edition, 1981, pp 490). FIG. 1 shows a MIS transistor which has such a concave MOS structure and which comprises a semiconductor substrate 1, source/drain regions 2, a channel plane arranged therebetween, an $SiO_2$ film 51 provided on the top of the channel plane 7, and a gate electrode 6 facing the channel plane via the $SiO_2$ film 51.

In FIG. 1, each of the source/drain regions 2 include a first impurity diffusion region 2a formed in the semiconductor substrate 1 (below the channel plane 7 in the drawing), and a second impurity diffusion region 2b laminated outside of the channel plane 7 (above the channel plane 7 in the drawing). Such a structure wherein the gate electrode 6 is surrounded by the second impurity diffusion regions 2b via the $SiO_2$ film 51 may be considered as a construction wherein a groove is formed in the source/drain regions 2 or as a construction wherein the second impurity diffusion regions 2b are elevated.

However, in the conventional MIS transistor having the structure shown in FIG. 1, the gate electrode 6 is surrounded by the source/drain diffusion layer 2 via the $SiO_2$ (insulator) film 51, so that there is a problem in that the gate-to-drain capacitance and source-to-drain capacitance increase, so that the switching speed of the transistor deteriorates to a large extent.

As described above, in the conventional MIS transistor, there is a problem in that it is not possible to reduce both of the resistance of the source/drain diffusion layer and the gate parasitic capacitance.

SUMMARY OF THE INVENTION

It is therefore an object of the present invention to eliminate the aforementioned problems and to provide a MIS transistor and a method for producing the same, capable of reducing both of the resistance of a source/drain diffusion layer and a gate parasitic capacitance.

In order to accomplish the aforementioned and other objects, according to a first aspect of the present invention, a MIS transistor basically comprises a semiconductor substrate, source/drain regions formed on the substrate, and a gate electrode provided above a channel region between the source/drain regions, the top surfaces of the source/drain regions formed on the semiconductor substrate being arranged toward the gate electrode from a reference plane of a channel plane in the semiconductor substrate, and the top surfaces of the source/drain regions are arranged toward the channel plane from a reference plane of an interface between a gate insulator film formed on the channel plane and the gate electrode.

In the MIS transistor according to the first aspect of the present invention, a groove may be formed in the top surface of the semiconductor substrate and has a bottom surface serving as the channel plane, the gate insulator film being formed in an opening of the groove via a protective film, the gate electrode being arranged on the top of the gate insulator film, the source/drain regions being arranged on both sides of the channel plane, so that a predetermined relationship between the top surfaces of the source/drain regions, the channel plane and the interface is established.

In addition, in the MIS transistor according to the first aspect of the present invention, the top surfaces of the source/drain regions laminated in places which sandwich the channel plane on the semiconductor substrate therebetween may be arranged toward the gate electrode from a reference plane of the channel plane, and the top surfaces of the source/drain regions may be arranged toward the channel plane from a reference plane of the interface between the gate insulator film formed on the channel plane via a protective film and the gate electrode.

Moreover, in the MIS transistor described in the above paragraph, the top surfaces of the source/drain regions provided so as to sandwich the channel plane therebetween may be elevated from the channel plane to be arranged on the side of the gate electrode, and the top surfaces of the source/drain regions may have a substantially flat surface having a level which is elevated and arranged on the side of the gate electrode, and an inclined surface which is inclined from the level of the flat surface to a level of the channel plane.

In addition, in the MIS transistor according to the first aspect of the present invention, the gate electrode surrounded by the gate insulator film provided on the upper side of the channel plane may have a cross section of a T shape, the lower side of which is tapered.

According to a second aspect of the present invention, a MIS transistor basically comprises a semiconductor substrate, source/drain regions formed on the substrate, and a gate electrode provided above a channel region between the source/drain regions, the top surfaces of the source/drain regions provided so as to sandwich the channel plane therebetween being elevated from the channel plane to be arranged on the side of the gate electrode, and the top surfaces of the source/drain regions having a substantially flat surface having a level which is elevated and arranged on the side of the gate electrode, and an inclined surface which is inclined from the level of the flat surface to a level of the channel plane, the gate electrode surrounded by the gate insulator film provided on the upper side of the channel plane having a cross section of a T shape, the lower side of which is tapered via a step portion.

According to a third aspect of the present invention, there is provided a method for producing a MIS transistor comprising a semiconductor substrate, source/drain regions formed on the substrate, and a gate electrode provided above a channel region between the source/drain regions, the method comprising the steps of: selectively forming an oxide film on the semiconductor substrate; using the selectively formed oxide film as a mask to carry out etching to form a groove; laminating a semiconductor layer in the groove to polish the top surfaces of the oxide film and the semiconductor film, and thereafter, removing the oxide film; using the semiconductor film as a mask to diffuse an impurity in the surface of the semiconductor substrate to form a grooved impurity diffusion region including the bottom of the groove; arranging a gate insulator film of a high dielectric film in a groove portion of the grooved impurity diffusion region so that the top surface of the gate insulator film is arranged farther from the semiconductor substrate than the top surface of the impurity diffusion region other than the groove portion; and forming a gate electrode on the top surface of the gate insulator film.

According to a fourth aspect of the present invention, there is provided a method for producing a MIS transistor comprising a semiconductor substrate, source/drain regions formed on the substrate, and a gate electrode provided above a channel region between the source/drain regions, the method comprising the steps of: selectively forming a semiconductor layer on the semiconductor substrate; using the selectively formed semiconductor layer as a mask to diffuse an impurity in the surface of the semiconductor substrate to form an impurity diffusion region including an elevated impurity diffusion region elevated from a channel plane which is formed on the surface of the masked semiconductor substrate; forming an oxide film on the side of the surface of the elevated impurity diffusion region to use the semiconductor layer as a stopper to polish the surface of the oxide film, and thereafter, removing the semiconductor layer; forming a gate insulator film of a high dielectric film in a region surrounded by the elevated impurity diffusion region and the oxide film so that the top surface of the gate insulator film is arranged farther from the substrate than the interface between the impurity diffusion region and the oxide film; and forming a gate electrode on the top surface of the gate insulator film.

According to a fifth aspect of the present invention, there is provided a method for producing a MIS transistor comprising a semiconductor substrate, source/drain regions formed on the substrate, and a gate electrode provided above a channel region between the source/drain regions, the method comprising the steps of: selectively depositing semiconductor layers serving as source/drain regions, which sandwich a region serving as a channel plane on the semiconductor substrate therebetween, so that an inclined surface is formed between the top surface of the semiconductor layers and the channel plane; forming a dummy gate insulator film and a dummy gate electrode including a second semiconductor layer on the channel plane, which borders the selectively formed semiconductor layers, by a technique including at least a lithography; using the second semiconductor layer as a mask to diffuse an impurity in the surface of the semiconductor substrate to form impurity diffusion regions; removing the dummy gate electrode, which is formed on a portion serving as the channel plane sandwiched between the impurity diffusion regions, by etching; depositing an insulator film of a high dielectric film on the whole surface of the exposed channel plane to form a gate insulator film, which has a cross section of a grooved space at the center thereof; and depositing a gate electrode on the top surface of the gate insulator film, which is formed on the whole surface so as to have a grooved space at the center thereof, to form a gate electrode having a cross section of a T shape.

As described above, in a MIS transistor according to the present invention, a gate insulator film of a high dielectric film and a groove or source/drain elevated structure are used, and a gate electrode having a capacitor reduced thickness equal to a capacitor reduced thickness obtained by dividing a real thickness of the gate insulator film by an average dielectric constant is provided so that the bottom surface of the gate electrode is arranged at a higher position than the surface of a semiconductor substrate by a greater amount than the real thickness of an insulator film between the gate electrode and a source/drain. Thus, it is possible to achieve both of the reduction of the resistance of the diffusion layer of the source/drain and the reduction of the gate parasitic capacitance.

In addition, in a MOS transistor according to the present invention, the average dielectric constant of a first insulator film serving as the gate insulator film may be higher than the average dielectric constant of a second insulator film for insulating the top surface of the groove from the gate material.

Moreover, in such a MOS transistor, the first insulator film serving as the gate insulator film may have a laminated structure of an insulator film, which has a higher dielectric constant than that of an $SiO2$ film, and a buffer insulator film for protecting the insulator film.

In addition, in the above described MIS transistor, the bottom surface of the gate electrode may be arranged at a higher position than the surface of the semiconductor substrate by a greater amount than the real thickness of the semiconductor insulator having a capacitor reduced thickness which is equal to a capacitor reduced thickness obtained by dividing the real thickness of the gate insulator film by an average dielectric constant. As described above, according to the present invention, it is possible to achieve both of the reduction of the resistance of the diffusion layer of the source/drain and the reduction of the gate parasitic capacitance.

DESCRIPTION OF THE PREFERRED EMBODIMENTS

Referring now to the accompanying drawings, the preferred embodiments of a MIS transistor and a method for producing the same according to the present invention will be described in detail below.

Figure 1:
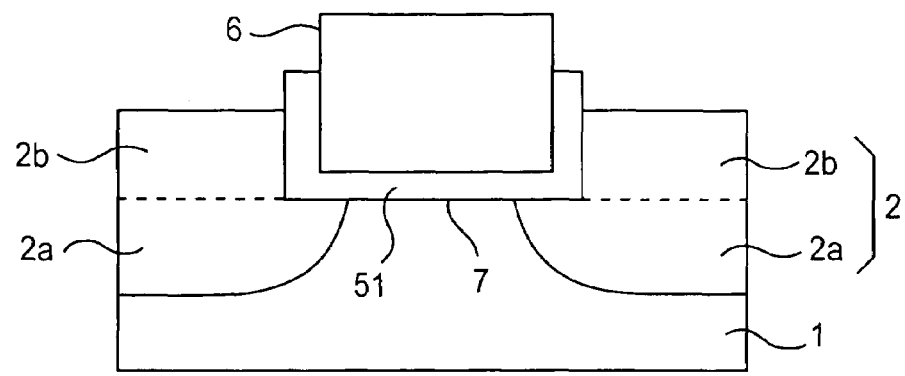
FIG. 1 is a sectional view of a conventional MIS transistor.
Figure 2:
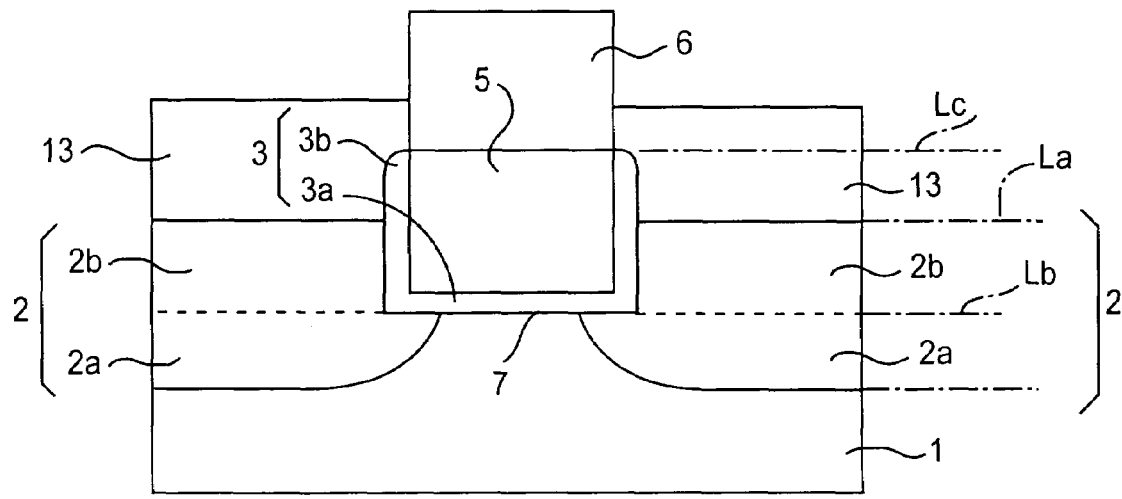
FIG. 2 is a sectional view of the first preferred embodiment of a MIS transistor according to the present invention.

FIG. 2 is a schematic sectional view of the first preferred embodiment of a MIS transistor according to the present invention. Furthermore, hatching is omitted from the drawings to make the indication thereof clear. The components or constituents having the same reference numbers as those in FIG. 1 denote components or constituents which are the same as or similar to those of the conventional MIS transistor.

In FIG. 2, reference number 1 denotes a semiconductor substrate. On the surface of the semiconductor substrate 1, impurity regions 2 serving as source/drain regions are provided via a channel region 7. When the transistor operates, one of the impurity regions 2 serves as a drain electrode, and the other impurity region 2 serves as a source electrode. Above the channel plane 7 between the impurity regions 2, a recessed portion or groove 4 is formed. In the groove 4, a high dielectric gate insulator film 5 is provided via a protective film 3. On the top of the high dielectric gate insulator film 5, a gate electrode 6 is provided. The impurity regions 2 serving as the source/drain regions are insulated from the gate electrode by an insulator film 13. The high dielectric gate insulator film 5 has a higher dielectric constant than 3.9 which is the relative dielectric constant of the $SiO_2$ film of the conventional MIS transistor shown in FIG. 1.

In the above described construction, it is important that the level La of the top surface of the source/drain between the second impurity diffusion region 2b and the insulator film 3 is arranged farther from the semiconductor substrate 1 than the level Lb of the channel plane 7, and nearer to the semiconductor substrate 1 than the level Lc of the bottom surface of the gate electrode 6.

Similar to the conventional MIS transistor shown in FIG. 1, the impurity regions 2 include a first impurity diffusion region 2a formed in the semiconductor substrate 1 (below the channel plane 7 in the drawing), and a second impurity diffusion region 2b laminated outside of the channel plane 7 (above the channel plane 7 in the drawing). The protective film 3 is formed of, e.g., a SiN or oxynitride film, for protecting the gate insulator film 5. The protective film 3 includes a first protective film 3a arranged between the channel plane 7 and the gate insulator film 5, and a second protective film 3b arranged between the second impurity diffusion region 2b and the gate insulator film 5.

With this construction, in the first preferred embodiment of a MIS transistor according to the present invention similar to the conventional MIS transistor of FIG. 1, the impurity diffusion regions serving as the source/drain regions are formed so as to be elevated from the channel plane 7 forming a channel, through which a current passes, by the thickness of the second impurity diffusion region 2b opposite to the semiconductor substrate 1. Therefore, the resistance of the diffusion layer can be lower than with that in a case where the source/drain regions are formed only in the first impurity diffusion region 2a below the channel plane 7. It is also possible to prevent the junction leak, which is caused by the intrusion of silicidation to the junction surface, from being caused when a silicide of nickel (Ni), titanium (Ti) or the like is formed.

In addition, the bottom surface 8 of the gate electrode 6 is arranged at a higher position than the top surface of the impurity diffusion regions 2 serving as the source/drain regions, i.e., apart from the semiconductor substrate 1, so that the capacitance between the gate electrode and the source/drain, which deteriorates the performance of the transistor, can be considerably reduced in comparison with the conventional concave MOS shown in FIG. 1. Moreover, the distance between the gate electrode 6 and the source/drain electrode 2b can be greater than that of the conventional concave MOS, so that it is possible to hold a small electric field. Therefore, it is possible to reduce a leakage current between the gate electrode 6 and the source/drain electrode 2b to prevent the dielectric breakdown. This feature is applied to all of preferred embodiments which will be described below.

In a conventional MIS transistor (not shown) wherein a channel plane and the top surfaces of source/drain regions are arranged on the same plane, if a gate insulator film provided between a gate electrode and the channel plane is formed of an $SiO_2$ film, the bottom surface 8 of the gate electrode 6 is higher than the plane 7 from the thickness of $5_2$, and an insulator film for insulating the gate electrode from the source/drain regions is formed of an $SiO_2$ film, so that it is possible to reduce the parasitic capacitance in comparison with that of the conventional plane type MOS transistor.

For example, in the prior art, the gate length is 0.1 microns, the gate oxide film is scaled so as to have a thickness of about 3 nm. On the other hand, according to the present invention, when a device is designed by a protective film of $Ta_2O_5$ having a relative dielectric constant of about 25 and SiN (relative dielectric constant=7.5) having a thickness of 1 nm, if the reduced thickness of $SiO_2$ is maintained to be 3 nm in order to have the same surface charge density Qs of transistors, the real thickness of SiN of a first protective film 3a is 1 nm, so that the reduced thickness of $SiO_2$ is "1 nm×3.9/7.5=0.52" nm. Moreover, the reduced thickness of $SiO_2$ of the high dielectric gate insulator film 5 ($Ta_2O_5$) is "3 nm−0.52 nm=2.48 nm", so that the real thickness is "2.48 nm×25/3.9=15.9 nm".

That is, if the depth of the groove of the impurity diffusion region serving as the source/drain region is "15.9 nm (corresponding to the thickness of the gate insulator film 5)+1 nm (corresponding to the thickness of the protective film 3a)=16.9 nm", the bottom surface 8 of the gate electrode 6 has the same level as that of the surface of the source/drain region, and if the depth is 13.9 nm, it has substantially the same parasitic capacitance as that of a MOS transistor using an oxide film having a thickness of 3 nm on a conventional scaling trend. According to the conventional scaling, the depth of the diffusion of 0.1 micron transistor is about 40 nm, so that the thickness of the diffusion layer can be increased by 13.9 nm, i.e., 35%, to reduce the parasitic resistance thereof.

Assuming that the relative dielectric constant of $SiO_2$ is $\epsilon$, the thickness of the $SiO_2$ film being $TSiO_2$, the relative dielectric constant of the high dielectric gate insulator film 5 being $\epsilon 5$, the real thickness thereof being T5, the relative dielectric constant of the protective film 3 being $\epsilon 3$, and the real thickness thereof being T3, then a thickness for providing the same parallel plane capacitance as that of the $SiO_2$ film having the thickness of $TSiO_2$ should meet the following formula.

$$TSiO_2/\epsilon SiO_2 = T3/\epsilon_2 + T5/\epsilon_5$$

If the protective film is formed of an SiN film having a thickness of 1 nm and if the relative dielectric constants of $SiO_2$ and SiN are 3.9 and 7.5, respectively, T5=$\epsilon 5$ ($TSiO_2$/3.9–1/7.5) (nm). Therefore, assuming that the thickness on the conventional scaling trend is $TSiO_2$ and that the depth of the groove for providing the same parasitic capacitance is set so that the insulator material between the gate and the source/drain is $SiO_2$ or a material having the same dielectric constant as that of $SiO_2$, the following formula is established.

$$D\text{concave} = \epsilon_5 (TSiO_2/3.9 - 1/7.5) - TSiO_2$$

Thus, as the groove is shallower, the parasitic capacitance is smaller. When a titanium oxide film, $TiO_2$ film, which has a relative dielectric constant of about 80, which is thermally stable and which needs no protective film, is used, then the following formula is established similar to the same calculation as that when the protective film is removed.

$$D\text{concave} = \epsilon_5 \times TSiO_2/3.9 - TSiO_2$$

If the depth of the groove is 58.5 nm, it has the same parasitic capacitance as the conventional MOS transistor using an oxide film of a thickness of 3 nm, and it is possible to increase the thickness of the diffusion layer by 150% and to reduce the parasitic resistance in comparison with the case where a conventional diffusion layer having a depth of 40 nm is used.

Figure 3A:
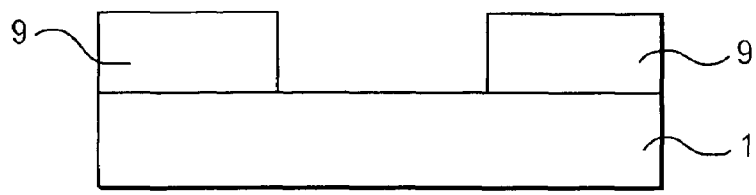
FIGS. 3A through 3E are sectional views showing steps of a method for producing the first preferred embodiment of a MIS transistor according to the present invention.
Figure 3B:
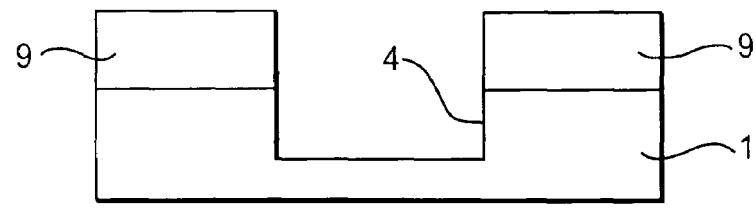

Referring to FIGS. 3A through 3E, a method for producing the first preferred embodiment of a MIS transistor according to the present invention will be described. First, as shown in FIG. 3A, an $SiO_2$ film 9 is deposited on a silicon substrate serving as a semiconductor substrate to be etched by a lithography. Then, using an $SiO_2$ film 9 as a mask, a groove 4 is formed by the reactive ion etching (RIE) (FIG. 3B).

Figure 3C:
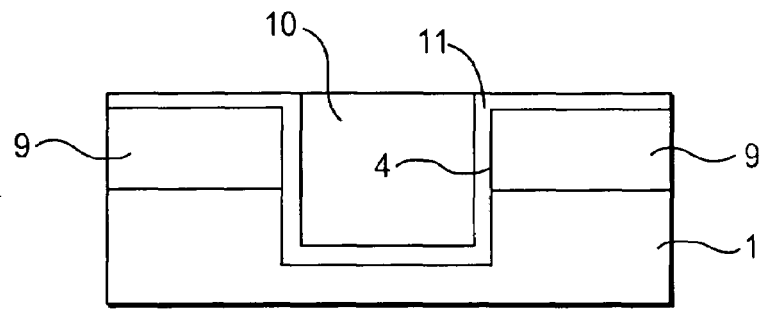

Then, as shown in FIG. 3C, after a thin sacrificial oxide film 11 is laminated on the surfaces of the $SiO_2$ film 9 and the groove 4 of the silicon substrate, a polycrystalline silicon 10 is deposited to be planarized to the top surface of the $SiO_2$ film 9 using the chemical mechanical polishing (CMP) method or the etch back. At this time, the lamination of the thin sacrificial oxide film 11 is used for separating the polycrystalline silicon 10 from the silicon substrate 1.

Figure 3D:
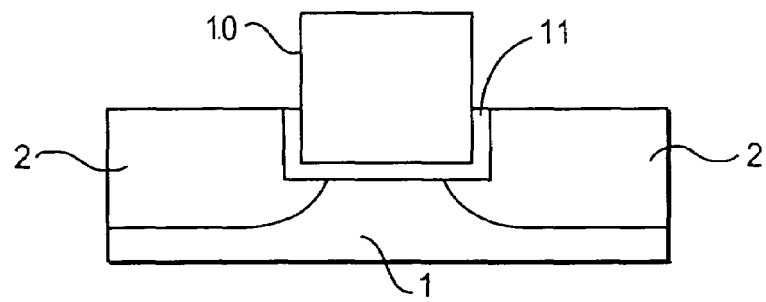
Figure 3E:
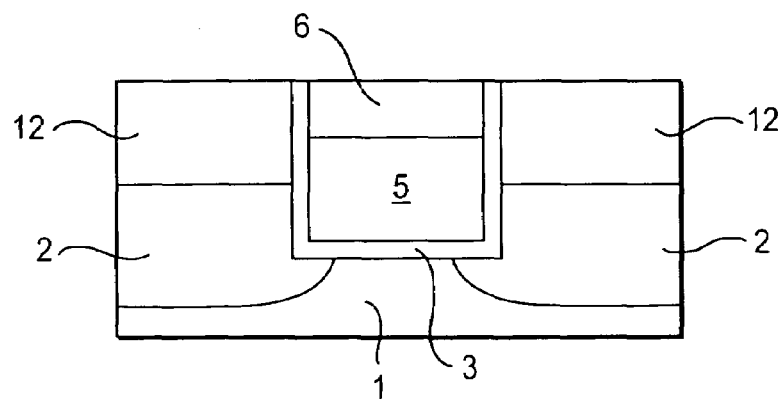

Then, as shown in FIG. 3D, after the silicon oxide ($SiO_2$) film 9 is removed, the polycrystalline silicon 10 is used as a mask to form a source/drain region 2 using the ion implantation or solid phase diffusion technique. Then, the polycrystalline silicon 10 and the sacrificial oxide film 11 are removed by, e.g., the chemical dry etching (CDE). Thereafter, as shown in FIG. 3E, an SiN film 3 serving as a protective film is deposited or formed by the heat nitriding. Then, a high dielectric film 5 is formed by a sputtering technique, and a gate electrode 6 is deposited. Finally, a silicon (Si) oxide film 12 is formed to produce a semiconductor device having the same structure as that of the MIS transistor shown in FIG. 2.

Referring to FIGS. 4A through 4E, a method for producing the second preferred embodiment of a MIS transistor according to the present invention, and the construction thereof will be described below. First, referring to FIGS. 4A through 4E, the method for producing the MIS transistor will be described.

Figure 4A:
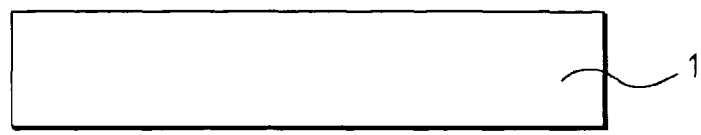
FIGS. 4A through 4E are sectional views showing steps of a method for producing the second preferred embodiment of a MIS transistor according to the present invention.
Figure 4B:
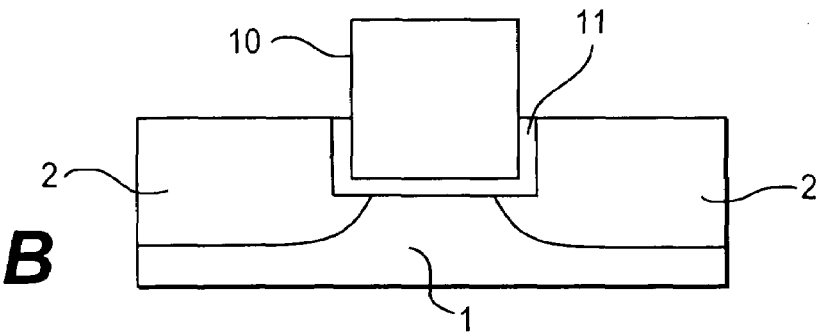

A dummy polycrystalline silicon 10 is formed on a semiconductor substrate 1 shown in FIG. 1 via a sacrificial oxide film 11 to be patterned. Moreover, after oxidation is carried out so that the dummy polycrystalline silicon 10 is surrounded by an oxide film, a source/drain region 2 is formed by the ion implantation or the like as shown in FIG. 4B.

Then, after the silicon is elevated by the selective epitaxial growth technique, an impurity is implanted into the elevated portion again by the additional ion implantation to be diffused. In the method for producing the first preferred embodiment of a MIS transistor according to the present invention, the groove 4 is first formed, and the impurity is implanted into the groove from the top to be diffused therein, so that it is difficult to control the depth of the source/drain region 2. On the other hand, in method for producing the second preferred embodiment of a MIS transistor according to the present invention, the depth of the source/drain region 2 underlying the channel plane 7 is determined by the degree of impurity implanted from the channel plane 7, so that there is an advantage in that control is easy.

Figure 4C:
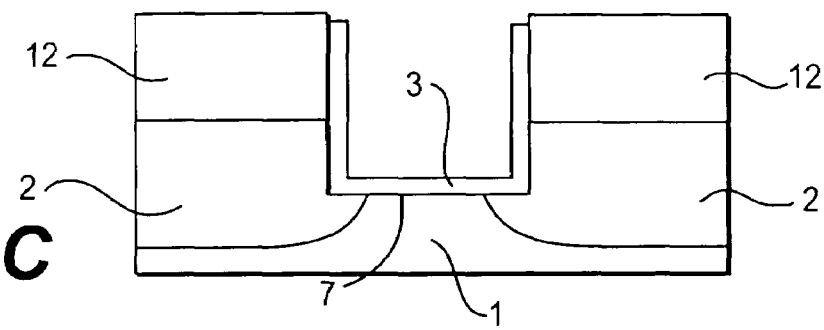

Then, a silicon (Si) oxide film 12 is deposited on the source/drain region 2 while leaving the polycrystalline silicon 10, and the silicon oxide film 12 is planarized to the top surface of the polycrystalline silicon 10 by the CMP technique using the polycrystalline silicon 10 as a stopper. As shown in FIG. 4C, the polycrystalline silicon 10 and the sacrificial oxide film 11 are peeled off by the CDE or the like, and a silicon nitride (SiN) protective film 3 is deposited on a region extending from the side surfaces of the silicon oxide film 12 and source/drain region to the top surface of the channel plane 7.

Figure 4D:
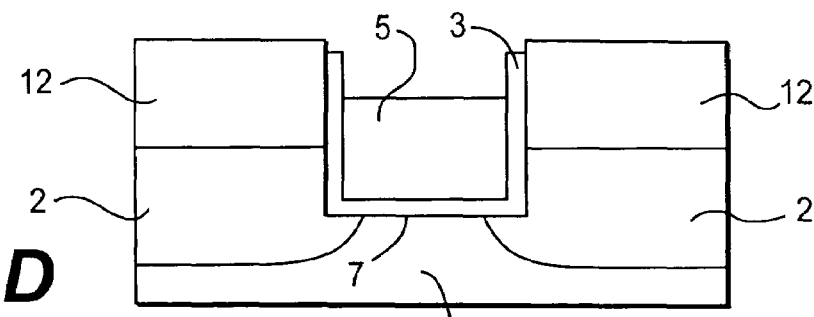

Then, as shown in FIG. 4D, a high dielectric gate insulator film 5 is deposited to a higher level than that of the top surface of the source/drain region 2 by the sputtering, CVD or the like. When such a process is adopted, if the thickness of the high dielectric gate insulator film 5 is smaller than the depth of the groove, the gate electrode must be insulated from the source/drain by the protective film 3, so that the protective film 3 must be thicker than that in a case where the level of the high dielectric gate insulator film 5 is higher than that of the groove 4 in this preferred embodiment.

Figure 4E:
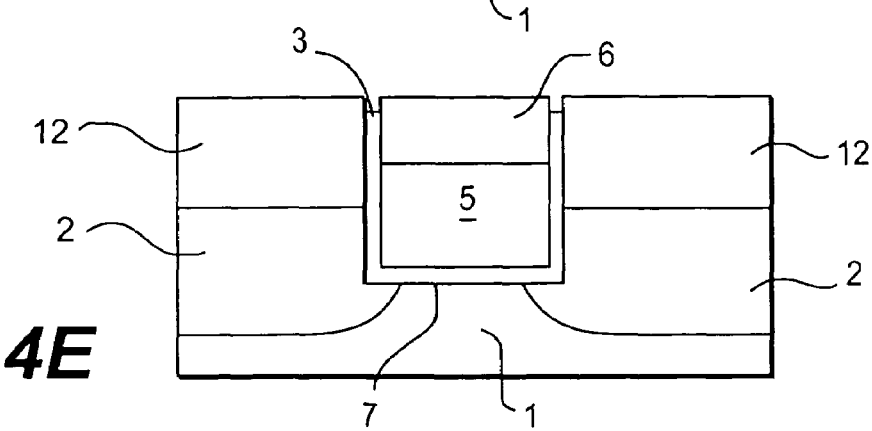

Then, as shown in FIG. 4E, a gate electrode 6 is deposited on the top of the high dielectric gate insulator film 5 to substantially the same level as that of the silicon oxide film 12 by the sputtering, CVD or the like. As described above, if the thickness of the high dielectric gate insulator film 5 is smaller than the depth of the groove, the gate electrode 6 is arranged nearest to the top surface of the source/drain region 2 only via the protective film 3, and the dielectric breakdown voltage of this portion is critical. Thus, in this state, it has been set to meet the following formula from its electric characteristics.

$$D\text{concave}=\epsilon_5 (TSiO_2/3.9-1/7.5)-TSiO_2$$

Therefore, it is desired that the groove portion be shallower in order to improve the dielectric breakdown voltage of the transistor. It is also desired that the thickness of the protective film 3 in the upper portion of the groove be thicker than that in the lower portion thereof in order to improve the dielectric breakdown voltage. This can be achieved by slightly etching and back filling a portion between the high dielectric gate insulator film 5 and the source/drain region 2 by the CDE or the like in the step of FIG. 4D.

According to the above described method for producing the second preferred embodiment of a MIS transistor according to the present invention, it is possible to obtain transistors having substantially the same construction after a different process from the producing method of the first preferred embodiment for forming the source/drain region 2 after forming the groove 4 using the SiO$_2$ film as a mask. However, there is a difference only between the considerations that the groove 4 is formed on the top surface of the substrate 1 and that the source/drain region 2 is formed on the substrate 1 to further elevate the source/drain region 2 from the level of the channel plane 7.

Figure 5:
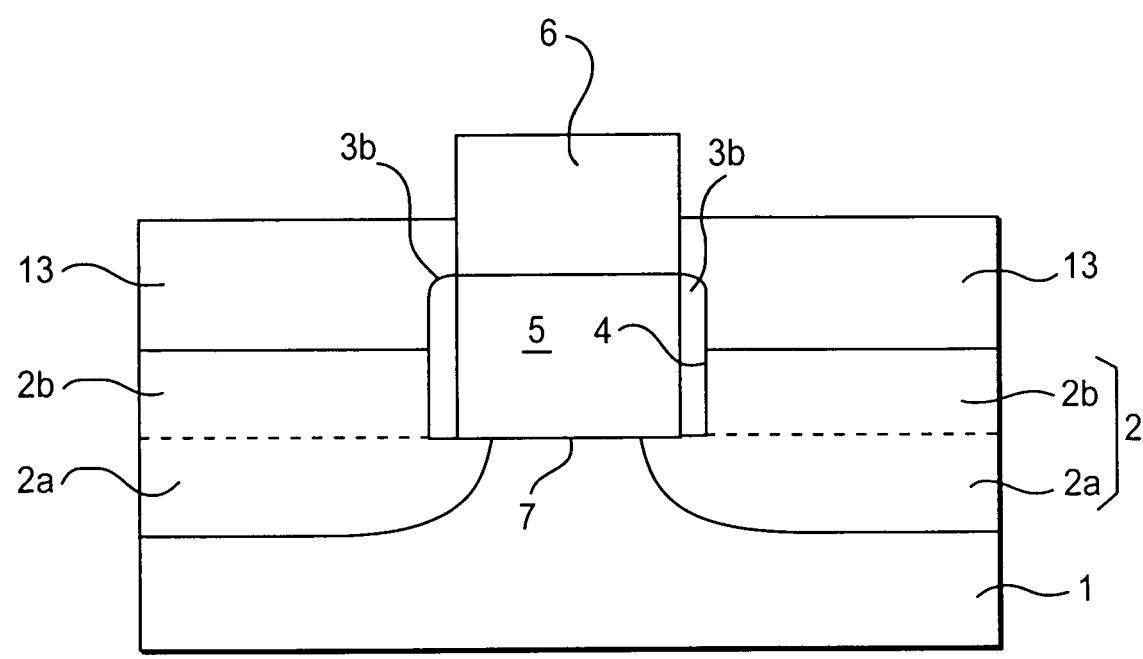
FIG. 5 is a sectional view of the third preferred embodiment of a MIS transistor according to the present invention.

In both of the first and second preferred embodiments of a MIS transistor according to the present invention, while the protective film 3 has been formed between the high dielectric gate insulator film 5 and the source/drain region 2, there are some cases where it is not required to provide the protective film 3 by controlling the material of the high dielectric gate insulator film 5 or by decreasing the temperature in the process. FIG. 5 shows the third preferred embodiment of a MIS transistor according to the present invention, wherein no protective film 3 is provided. In FIG. 5, a protective film (the protective film 3a in FIG. 2) is not provided between a channel plane 7 of a silicon substrate 1 serving as a semiconductor substrate and a high dielectric gate insulator film 5, so that a protective film 3b is provided only between the side wall of the gate insulator film 5 and a second impurity diffusion region 2b.

Figure 6A:
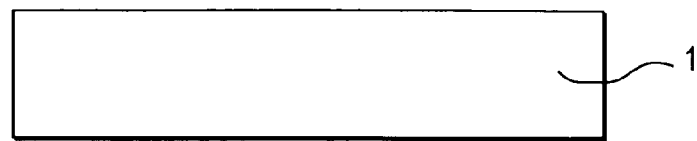
FIGS. 6A through 6E are sectional views showing steps of a method for producing the fourth preferred embodiment of a MIS transistor according to the present invention.
Figure 6B:
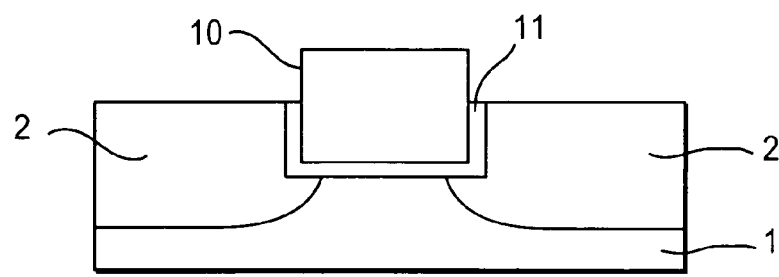
Figure 6C:
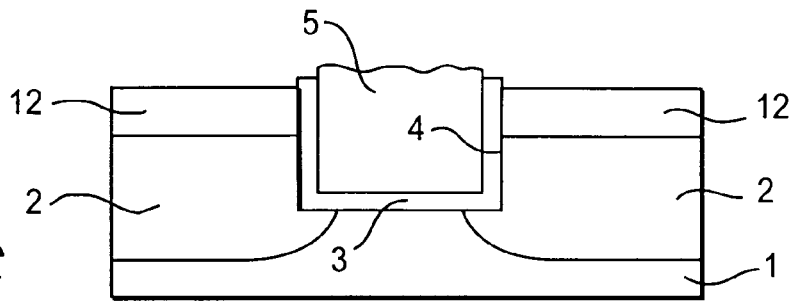
Figure 6D:
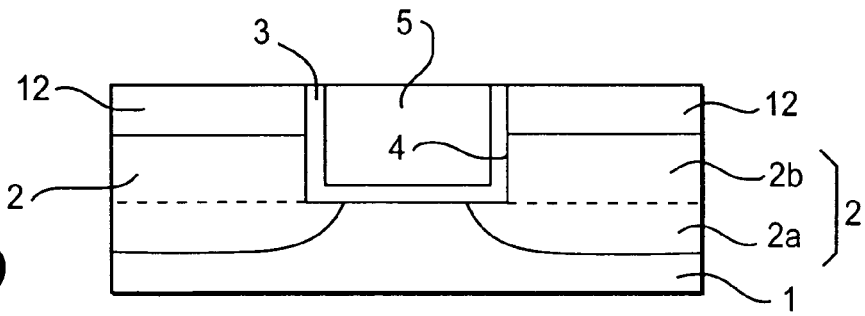

Referring to FIGS. 6A through 6E, a method for producing the fourth preferred embodiment of a MIS transistor according to the present invention will be described below. Basically, the steps of FIGS. 6A through 6C are substantially the same as those in the method for producing the first or second preferred embodiment of a MIS transistor according to the present invention. Then, a sacrificial oxide film 11 and a polycrystalline silicon 10, which are shown in FIG. 6B, are peeled off by the CDE or the like. Then, a silicon nitride (SiN) protective film 3 is deposited in a region extending from the side surfaces of a silicon oxide film 12 and source/drain region 2 to the top surface of a channel plane 7, and a high dielectric gate insulator film 5 is deposited by the CVD or sputtering.

Then, as shown in FIG. 6C, the high dielectric gate insulator film 5 deposited by the CVD or sputtering is planarized to the top surface of the oxide film 12 using the CMP technique. In a method for producing the third preferred embodiment of a MIS transistor according to the present invention, the thickness of the high dielectric gate insulator film 5 is determined by the thickness of the silicon oxide film 12 and the depth of the groove 4, so that there is an excellent advantage in that it is easy to control the thickness.

Figure 6E:
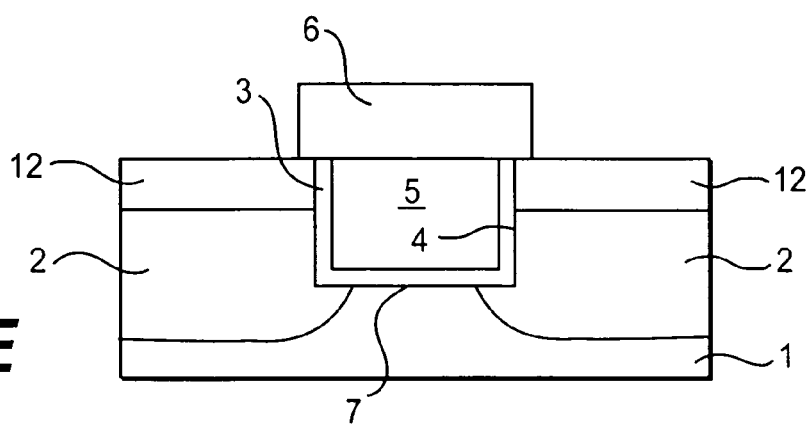

However, in the case of a method for producing the fourth preferred embodiment of a MIS transistor according to the present invention, the gate electrode 6 is formed by carrying out the lithography again, it is difficult to self-align the gate electrode 6 in the groove 4. Thus, as shown in FIG. 6E, the gate electrode 6 is formed so as to be greater than the area of the opening of the groove 4. Therefore, although the parasitic capacitance of the gate electrode is slightly increased, the silicon oxide film 12 is sufficient thick, and the dielectric constant of the silicon oxide film 12 is also small, so that it does not have a great influence.

Figure 7:
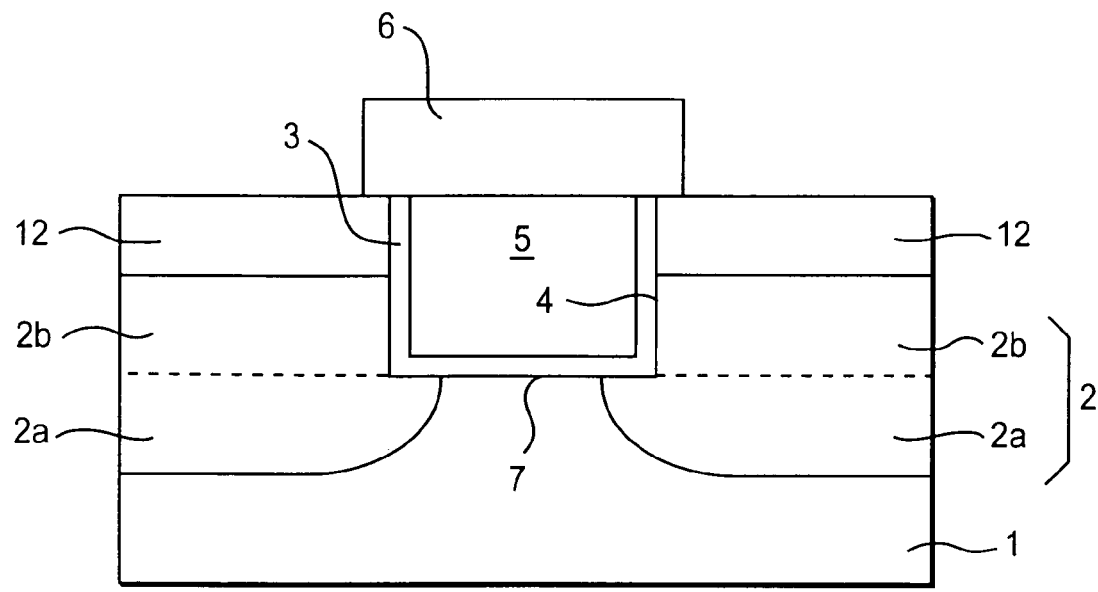
FIG. 7 is a sectional view of the fourth preferred embodiment of a MIS transistor according to the present invention.

FIG. 7 shows a cross section of the fourth preferred embodiment of a MIS transistor according to the present invention, which is produced by the method shown in FIGS. 6A through 6E. In FIG. 7, the MIS transistor comprises: a silicon substrate serving as a semiconductor substrate; a source/drain region 2 including a first impurity diffusion region 2a arranged nearer to the substrate 1 than a channel plane 7, and a second impurity diffusion region 2b arranged toward a gate electrode 6 from a reference plane of the channel plane 7; a silicon oxide film 12; a protective film 3 on the inner wall of a groove 4 formed in the silicon oxide film 12 and second impurity diffusion region 2b; a high dielectric gate insulator film 5 formed in the groove 4 via the protective film 3; and the gate electrode 6 formed so as to have a greater area than that of a region surrounded by the protective film 3 on the gate insulator film 5.

Figure 8:
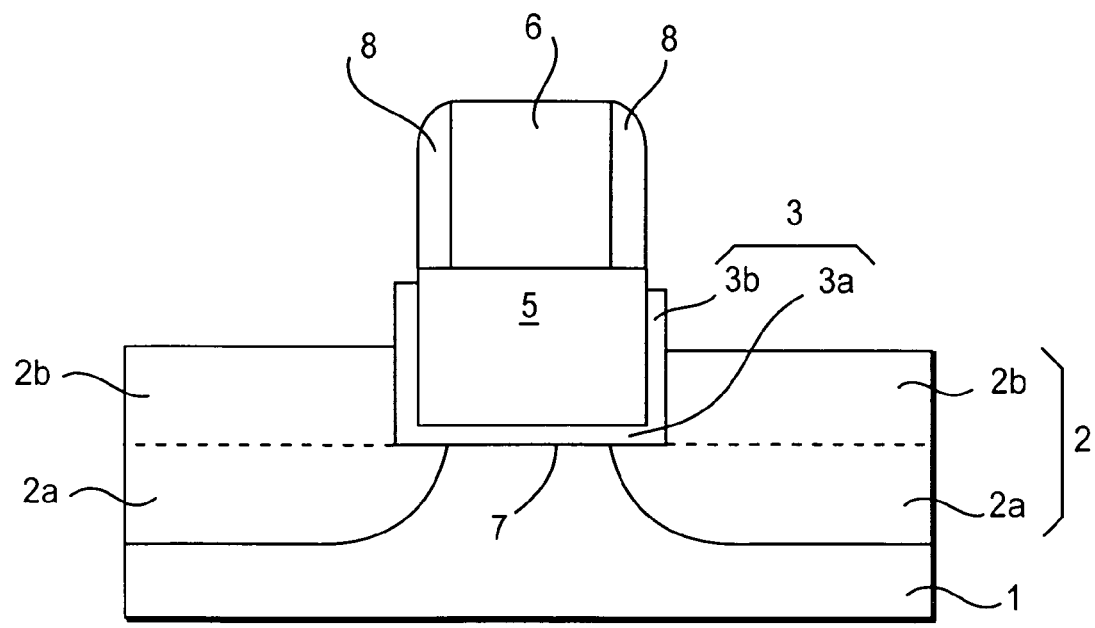
FIG. 8 is a sectional view of the fifth preferred embodiment of a MIS transistor according to the present invention.

Furthermore, while the gate electrode 6 has been had the same width as that of the gate insulator film 5 arranged in the groove 4 in the above described first through third preferred embodiments of a MIS transistor according to the present invention and while the gate electrode 6 has been wider than that of the gate insulator film 5 due to the difficulty of self-alignment in the fourth preferred embodiment of a MIS transistor according to the present invention, the present invention should not be limited thereto, but the invention may be applied to a transistor wherein a gate electrode 6 is provided with side walls in, e.g., the lightly doped drain (LDD) structure, in the fifth preferred embodiment of the present invention which is shown in FIG. 8.

In FIG. 8 showing the fifth preferred embodiment of a MIS transistor according to the present invention, reference number 1 denotes a silicon substrate serving as a semiconductor substrate, 7 denoting a channel plane, 2 denoting a source/drain region including a first impurity diffusion region 2a and a second impurity diffusion region 2b, 3 denoting a protective film, 5 denoting a high dielectric gate insulator film, 6 denoting a gate electrode, and 8 denoting a side wall of silicon dioxide (SiO$_2$) provided around the gate electrode 6.

Figure 9A:
FIGS. 9A through 9E are sectional views showing steps of a method for producing the fifth preferred embodiment of a MIS transistor according to the present invention.
Figure 9B:
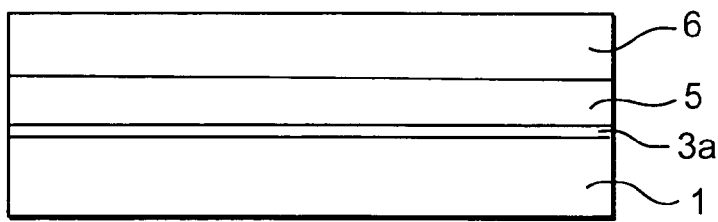
Figure 9C:
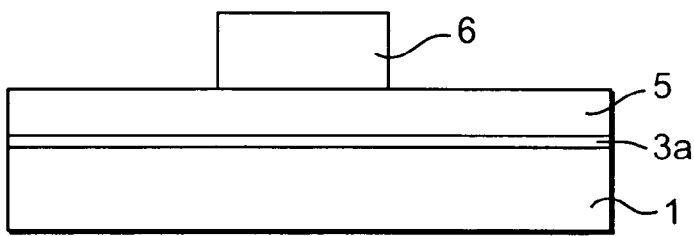
Figure 9D:
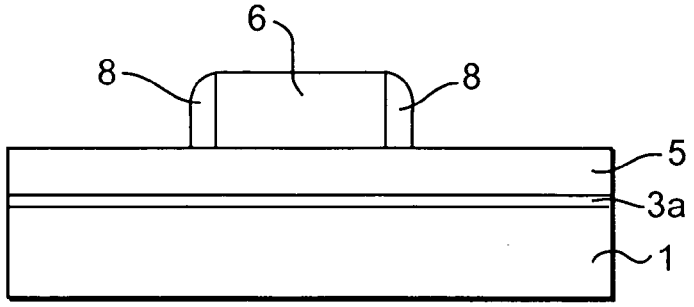

FIGS. 9A through 9E show sectional views showing steps of a method for producing the fifth preferred embodiment of a MIS transistor according to the present invention. As shown in FIG. 9A and 9B, an SiN film 3a serving as a gate insulator film, a high dielectric film 5 of, e.g., Ta$_2$O$_5$, a TiN film serving as a gate electrode, and a polycrystalline silicon 6 are sequentially deposited on a semiconductor substrate 1, and etching is carried out to form a portion serving as a gate electrode from the polycrystalline silicon 6 as shown in FIG. 9C. Then, as shown in FIG. 9D, a side wall 8 of SiO$_2$ is formed so as to surround the gate electrode 6 by the CVD or the like, and the gate electrode 6 and the side wall 8 are used as a mask to form a gate insulator film 5 by the CDE or the like.

Figure 9E:
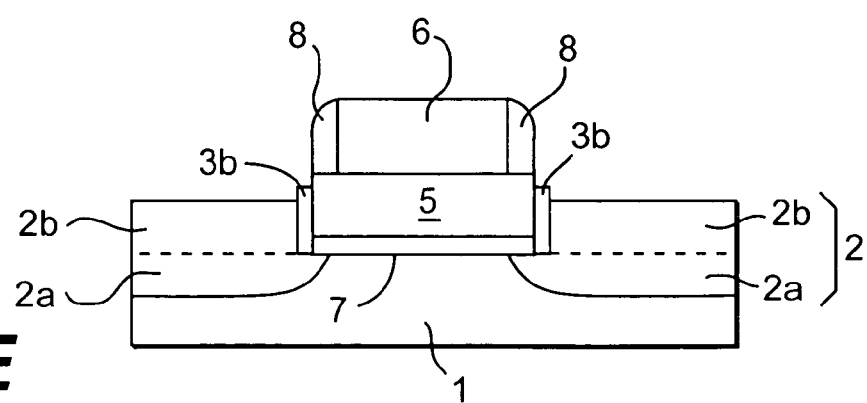

Finally, as shown in FIG. 9E, after etching is carried out using the laminated structure of the gate electrode 6 of polycrystalline silicon, the side wall 8 and the gate insulator film 5 is as a mask, a side wall insulator film 3b is formed, and the source/drain is elevated to form an electrode 2b. Thereafter, a source/drain region 2 is formed by the ion implantation and solid phase diffusion. Similar to the first through fourth preferred embodiments, the source/drain region 2 comprises: a first impurity diffusion region 2a arranged in the substrate 1 from the channel plane 7; and a second impurity diffusion region 2b which is arranged nearer to the gate electrode 6 than the channel plane 7 and the top surface of which is lower than the bottom surface of the gate electrode 6.

The fifth preferred embodiment of a MIS transistor according to the present invention, which is formed according to the process shown in FIGS. 9A through 9E, has the structure shown in FIG. 8. That is, the peripheral surfaces, i.e., at least the bottom surface and side surfaces, of the high dielectric gate insulator film 5 are surrounded by the protective film 3. In addition, the first protective film 3a is arranged between the lower side of the gate insulator film 5 and the channel plane 7 of the substrate 1, and the second protective film 3b is arranged between the second impurity diffusion region 2b and the gate insulator film 5.

Figure 10:
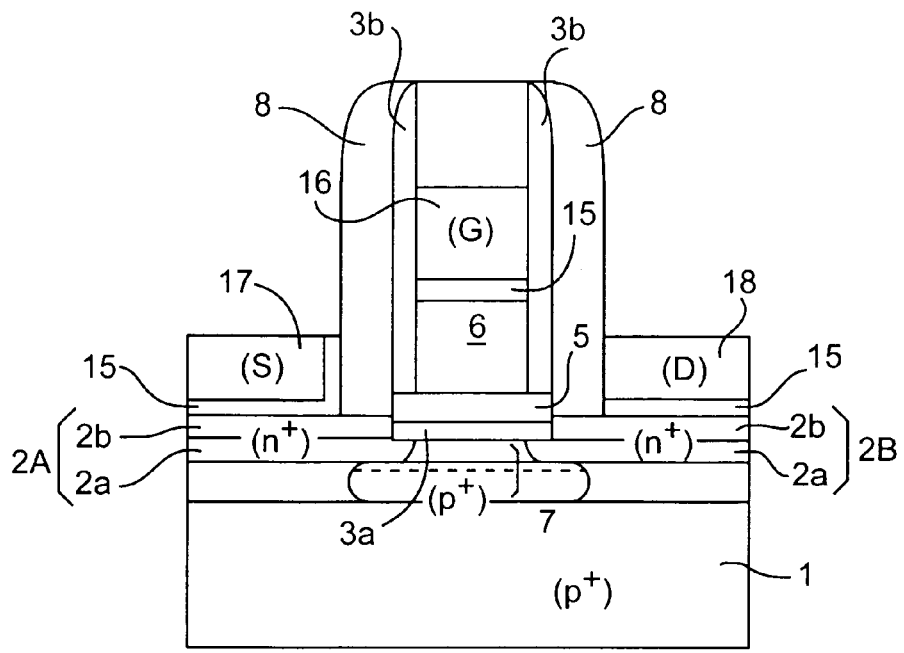
FIG. 10 is a sectional view of the sixth preferred embodiment of a MIS transistor according to the present invention.

Furthermore, the present invention should not be limited to the above described first through fifth preferred embodiments, but the invention may be extended to the sixth preferred embodiment of a transistor according to the present invention which is shown in FIG. 10. In FIG. 10, the transistor has substantially the same construction as those in some of the above described preferred embodiments, particularly as that in the fifth preferred embodiment of a MIS transistor according to the present invention, in respect of the fact that a p+ semiconductor substrate 1, a channel plane 7, a source region 2A, a drain region 2B, a high dielectric gate insulator film 5 and a gate electrode 6 are provided.

In the sixth preferred embodiment of a transistor according to the present invention which is shown in FIG. 10, each of electrode regions is provided with respective terminals, i.e., a gate terminal 16, a source terminal 17 and a drain terminal 18, via a low resistance contact 15. In addition, a protective film 3a is provided between the channel plane 7 and the gate insulator film 5. Moreover, a protective film 3b is also provided between the gate electrode 6 and the side wall 8 surrounding all of the low resistance contact 15 and the gate terminal 16.

The gate insulator film 5 is formed so that Ox corresponds to 1.5 nm or less. The low resistance contact 15 has a value of resistance of "Rcontact<$10^{-8}$ $\Omega cm^2$". The channel plane 7 is a very shallow channel (a retrograde channel) of "Rp~15 nm, dRp~7 nm". In addition, the source region 2A and the drain region 2B are formed so as to be a second impurity diffusion region 2B which has a low resistance of "Xj<10 nm, R<16 $\Omega\mu m$" and which is elevated by a very small thickness.

With this construction, the sixth preferred embodiment of a transistor according to the present invention also has the gist of the present invention wherein the top surface of the source/drain region is arranged toward the gate electrode from a reference plane of the channel plane and toward the substrate from a reference plane of the bottom surface of the gate electrode, and is one of the preferred embodiments of a MIS transistor according to the present invention.

Figure 11:
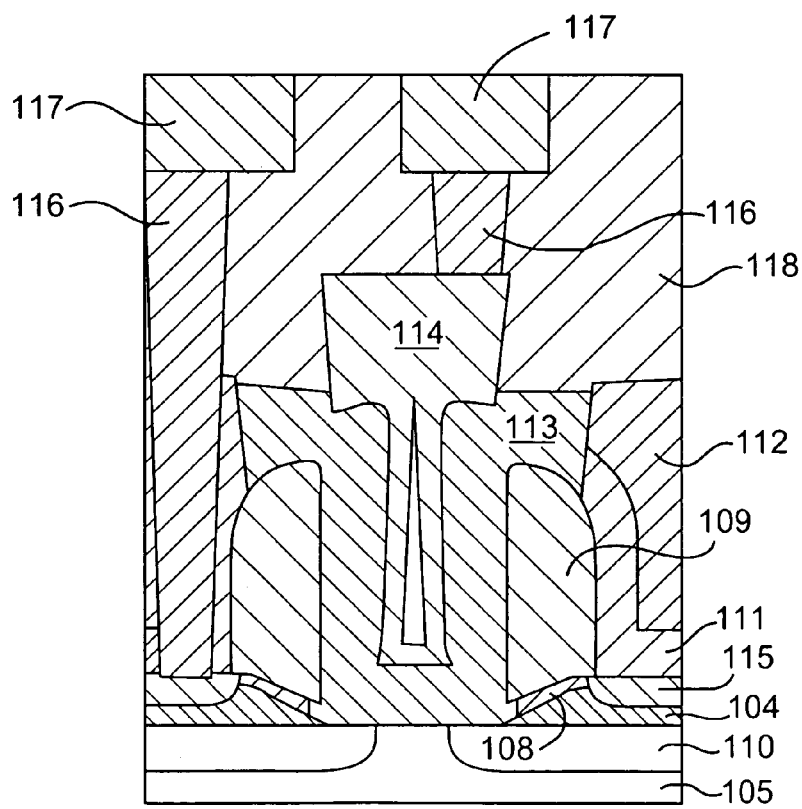
FIG. 11 is a sectional view of the seventh preferred embodiment of a MIS transistor according to the present invention.
Figure 12:
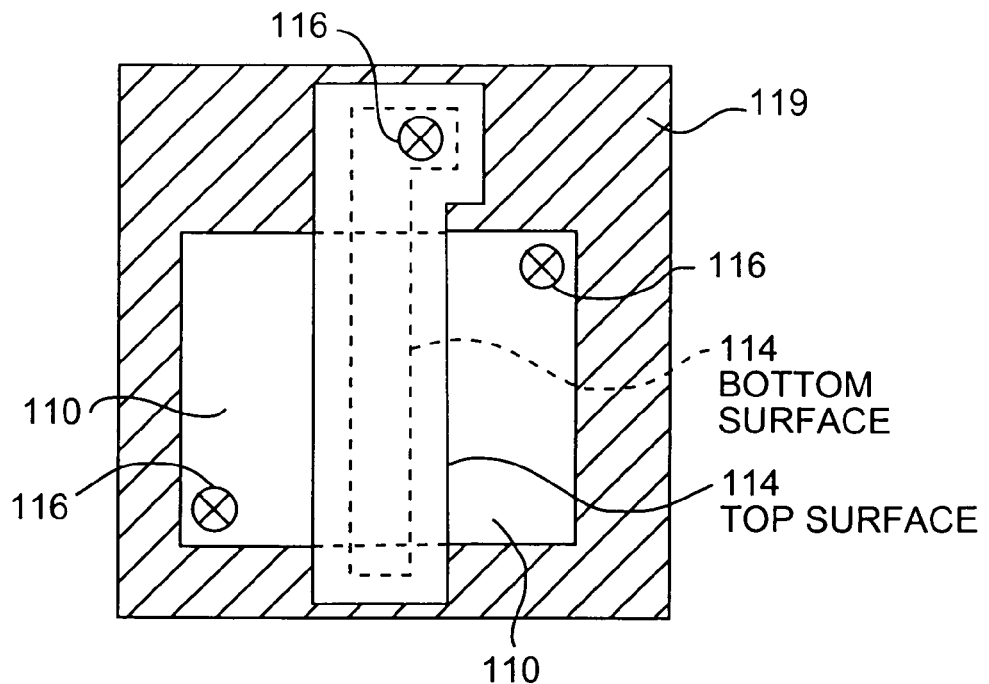
FIGS. 12A and 12B are plan views of the semiconductor device shown in FIG. 11.
Figure 12:
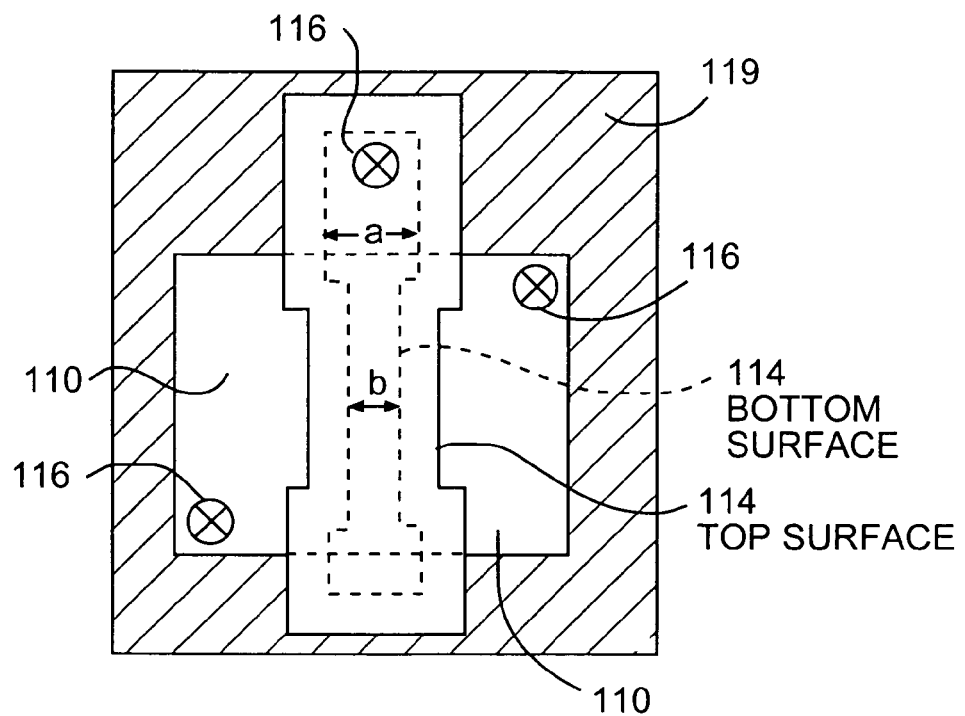

Referring to FIGS. 11 through 13E, the seventh preferred embodiment of a semiconductor device according to the present invention will be described below. First, a sectional structure of the seventh preferred embodiment of a semiconductor device according to the present invention is shown in FIG. 11.

In FIG. 11, a gate electrode 114 of, e.g., a polycrystalline Si, an amorphous Si, TiN, W, Pt, $RuO_2$ or $IrO_2$, is formed on the top of a semiconductor layer 105 of, e.g., p-type Si, via a gate insulator film 113 of, e.g., $TiO_2$, $Al_2O_3$, tantalum oxide film, barium titanate or lead zirconate titanate. Assuming that the thickness of a portion of the gate insulator film 113 contacting the semiconductor layer 105 is t (nm) and the relative dielectric constant thereof is $\epsilon$, the relationship of t<1.3 $\epsilon$ is satisfied.

In addition, the ion implantation or solid diffusion of P, Sb or As into regions 105 on both sides of the gate electrode is carried out to be grown, and a source diffusion layer and a drain diffusion layer 110, which have an opposite conductive type to that of the semiconductor layer 105, are formed to form an n-type MISFET. Moreover, on the top of the source and drain diffusion layers 110, a conductive region 104 of, e.g., Si, SiGe or SiGeC, to which P, Sb orAs is added, is formed. This conductive region 104 is formed at a higher level than the interface between the gate insulator film 113 and the semiconductor layer 105, and has a so-called elevated source/drain structure.

Moreover, on the side wall wherein the gate electrode 114 of the gate insulator film 113 is not formed, an insulator film 109 of, e.g., a silicon nitride film, is formed. In addition, an insulator film 108 of, e.g., silicon oxide film, is formed between the insulator film 109 and the conductive region 104. Moreover, on the top surface of the conductive region 104, on which the insulator films 108 and 113 are not formed, a conductive layer 115 of, e.g., cobalt silicide, nickel silicide or titanium silicide, is formed. The feature of the seventh preferred embodiment is that the top surface of the conductive region 104 is formed at a lower level than that of the bottom of the gate electrode 114. Thus, it is possible to hold a small capacitance between the gate electrode 114 and the conductive region 104 and to provide a source/drain region elevated structure. In addition, it is possible to decrease the depth of junction of the conductive region 104 and to provide a short channel effect, low resistance source/drain.

Moreover, on the top surface of the conductive layer 115, an insulator films 111 and 112 of, e.g., a silicon oxide film, are laminated. In order to form a contact 116 having a good shape even if it is difficult to etch the gate insulator film 113, it is desired that the top surface of the gate insulator film 113 is lower than the top surface of the insulator film 112. Moreover, an insulator film 118 of, e.g., a silicon oxide film or a silicon nitride film, is formed on the top of the gate electrode 114, the gate insulator film 113 and the insulator film 112. In addition, a contact electrode 116 of, e.g., a polycrystalline silicon, into which Al, P or B is doped, WSi, TiSi, W, AlSi, AlSiCu, Cu or TiN, is formed on the top of the gate electrode 114 and on the top of the electrode 115.

Moreover, a polycrystalline silicon, into which Al, P or B is doped, or a metal of WSi, TiSi, AlSi, AlSiCu, Cu or W is deposited on the top of the contact electrode 116 to form a top wiring layer 117. In FIG. 11, while the contact electrode 116 and wiring layer 117 to the gate electrode have been shown on the same cross section as that of the contact electrode 116 and wiring layer 117 to the source/drain electrode, it is not always required to form these electrodes on the same cross section, but these electrodes may be formed on different cross sections, which are taken along different planes, as shown in FIGS. 12A and 12B.

Referring to FIGS. 13A through 13E, a method for producing the seventh preferred embodiment of a semiconductor device according to the present invention will be described below. First, a semiconductor layer 105 having a p-type region having, e.g., a boron density of $10^{15}$ cm$^{-3}$ is prepared. Then, the ion implantation and well diffusion of boron of about $10^{12}$ to $10^{15}$ cm$^{-3}$ into the p-type semiconductor layer 105 may be carried out to achieve a well diffusion to optimize the density of the semiconductor layer 105. The energy of ion implantation is set to be, e.g., in the range of from 100 eV to 1000 eV. The density of these well regions may be in the range of from $10^{15}$ cm$^{-3}$ to $10^{19}$ cm$^{-3}$. Then, an element isolating region (not shown) of, e.g., an LOCOS isolation or a trench isolation, is formed.

Then, the ion implantation and well diffusion of boron or indium into the p-type semiconductor layer 105 may be carried out to optimize the density of the semiconductor layer 105. Then, the surface of the semiconductor layer 105 is oxidized or nitrided by, e.g., 3 to 50 nm to form a dummy gate insulator film 102, and a polycrystalline silicon film serving as a dummy gate electrode 101 having a thickness of, e.g., 10 to 200 nm is deposited on the whole surface. Moreover, after a silicon oxide film to be an insulator film 106 having a thickness of, e.g., 2 to 200 nm, is deposited on the whole surface or formed by the oxidation of the polycrystalline silicon film, the polycrystalline silicon film to be the insulator film 106 and the dummy gate electrode 101 is worked so as to reach the top of the insulator film 102 by the lithography and the reactive ion etching to form the dummy gate electrode 101. Then, after the silicon oxide film to be the insulator film 103 is deposited on the whole surface so as to have a thickness of, e.g., 2 to 50 nm, it is worked by the anisotropic etching to leave the side insulator film 103 on the side wall of the dummy gate electrode 101. Thereafter, the insulator film 102 is etched using the insulator film 103 as a mask to expose the semiconductor layer 105. Thus, the dummy gate electrode 101 is surrounded by the side wall insulator film 103 and the insulator film 106, which has been deposited immediately before the lithography, so that it is easy to selectively grow a semiconductor in the source/drain layer.

Then, as shown in FIG. 13A, a semiconductor layer 104 of Si, a mixed crystal of SiGe or a mixed crystal of SiGeC, which has a thickness of, e.g., 5 to 100 nm, is formed by the selective epitaxial growth method or selective deposition method. At this time, it is desired that doping is also carried out to add a donor impurity of As, Sb or P having a density of $10^{16}$ to $10^{21}$ cm$^3$ to the semiconductor layer 104 in order to form a low resistance, shallow junction. The semiconductor layer 104 may be formed by causing, e.g., As of AsH$_3$ or P of PH$_3$, to be absorbed into the surface of the semiconductor layer 105, and thereafter, by carrying out the selective epitaxial growth of, e.g., Si, a mixed crystal of SiGe or a mixed crystal of SiGeC.

In particular, if the semiconductor substrate has the plane {100} and if gate working is carried out by patterning the semiconductor substrate in parallel to the orientation <100>, the plane {311} is formed on the gate side wall portion as shown in FIG. 13A, so that it is possible to form a structure which is farther from the gate side wall at an upper portion, so that it is possible to hold a small capacitance between the gate and source and between the gate and drain.

Then, there is added a step of, e.g., diffusing an impurity added n-type region 110 into the p-type semiconductor layer 105 by heating at a temperature of 700 to 1100° C. in an atmosphere of Ar or N$_2$ for 0.01 to 60 min as shown in FIG. 13B. In order to increase the current driving power, it is desired that the diffusion time is typically a period of time that the n-type region 110 is formed below the dummy gate layer 101 and formed so as to reach below a gate electrode 114 which will be formed layer.

The step of forming the semiconductor layer 104 and the n-type region 110 may be replaced with a step of ion-implanting As, P or SB of $10^{13}$ to $10^{16}$ cm$^{-2}$ at an acceleration voltage of 1 to 100 eV to form an n-type region 110, and thereafter, selective-epitaxial-growing the semiconductor layer 104. Alternatively, it may be replaced with a step of forming an n-type region 110 by ion-implanting As, P or Sb of $10^{13}$ to $10^{16}$ cm$^{-2}$ at an acceleration voltage of 1 to 300 eV after forming a semiconductor layer 105, to which no impurity is intentionally added.

Moreover, e.g., a silicon oxide film of 2 to 100 nm is deposited on the whole surface to form an insulator film 108. Then, e.g., a silicon nitride film of 10 to 300 nm is deposited on the whole surface, and an insulator film 109 is formed on the side wall of the side insulator film 108 cut by the anisotropic etching, so that the shape shown in FIG. 13B can be obtained. The insulator film 108 is herein a buffer layer for the stress relaxation, etching selectivity and damage relaxation of the insulator film 109. If there is particularly no problem on the stress of the insulator film 109 and the etching selectivity of the insulator film to the semiconductor layer 104, no insulator film 108 may be provided.

It is desired that the sum of the thickness of the insulator film 108 and the thickness of the side insulator film 103 be smaller than the thickness of the insulator film 102 since the insulator film 109 is exposed to define the width of the gate insulator film 113 when the insulator film 102 is peeled off. The distance between the adjacent insulator films 109 is set to be twice or more as large as the thickness of a portion of the gate insulator film 113 contacting the semiconductor layer 105. Moreover, after the insulator film 108 is removed from the semiconductor layer by etching using the insulator film 109 as a mask, a silicide or metal is selectively formed on the semiconductor layer 104, which is to be a source/drain region, to form a source or drain electrode 115. To achieve this, e.g., Ni, Co or Ti is deposited on the whole surface by 0.01 to 0.03 μm, and a heat process of 600 degrees or higher is carried out to selectively form NiSi, CoSi or TiSi on the semiconductor layer 104, which is to be a source/drain region. The remaining metal is etched with an aqueous solution of, e.g., sulfuric acid, to be removed.

Moreover, e.g., a silicon oxide film of 5 to 100 nm is deposited on the whole surface to form an interlayer insulator film 111. Then, e.g., a silicon oxide film, PSG, BPSG or BSG of 50 to 1000 nm is deposited on the whole surface to be planarized by, e.g., the chemical mechanical polishing, to form an interlayer insulator film 112. Thereafter, the upper portion of the dummy gate electrode 101 is patterned by the lithography and anisotropic etching to etch parts of the interlayer insulator film 112, interlayer insulator film 111 and buffer insulator film 108, insulator film 106 and side insulator film 103 as shown in FIG. 13C to expose a part of the dummy gate electrode 101.

At this time, a silicon oxide film is formed by the films 112, 111, 108, 106 and 103, and the insulator film 109 is formed of a silicon nitride film, so that it is possible to selectively etch the films 112, 111, 108, 106 and 103 while leaving the insulator film 109. After this etching, it is desired that the resist, which has been used for the patterning, be removed by, e.g., ashing or an aqueous solution of sulfuric acid so as not to contaminate the gate insulator film 113 with metals or organic substances.

Then, the whole dummy gate electrode 101 is removed by, e.g., the reactive etching using a gas containing HBr. At this time, the films 112, 111, 108, 106 and 103 are left by holding the selectivity. Moreover, the whole dummy gate insulator film 102 of a silicon oxide film is removed by, e.g., dilute hydrofluoric acid, an aqueous solution of ammonium fluoride, or HF solution. At this time, the films 108 and 103 of a silicon nitride film are also etched and removed, and the side insulator film 109 of a silicon nitride film is not removed, so that the gate length can be defined by the interval therebetween. The step of removing the film 102 is preferably carried out by the wet etching, not the ion etching, so as not to damage the semiconductor layer 105.

Figure 13:
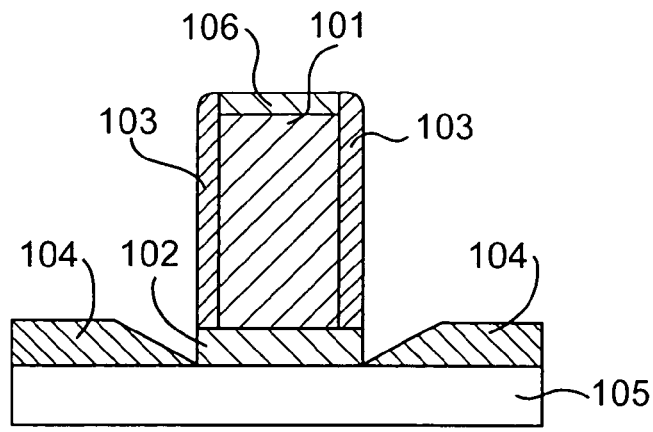
FIGS. 13A through 13E are sectional views showing steps for producing the seventh preferred embodiment of a semiconductor device according to the present invention.
Figure 13:
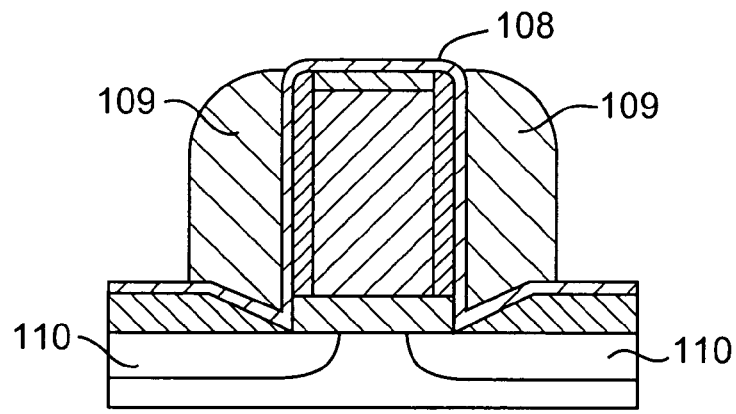
Figure 13:
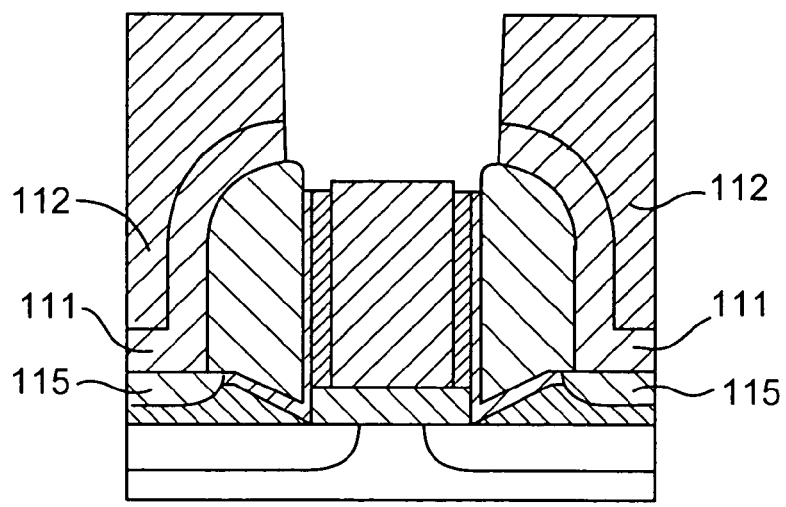
Figure 13D:
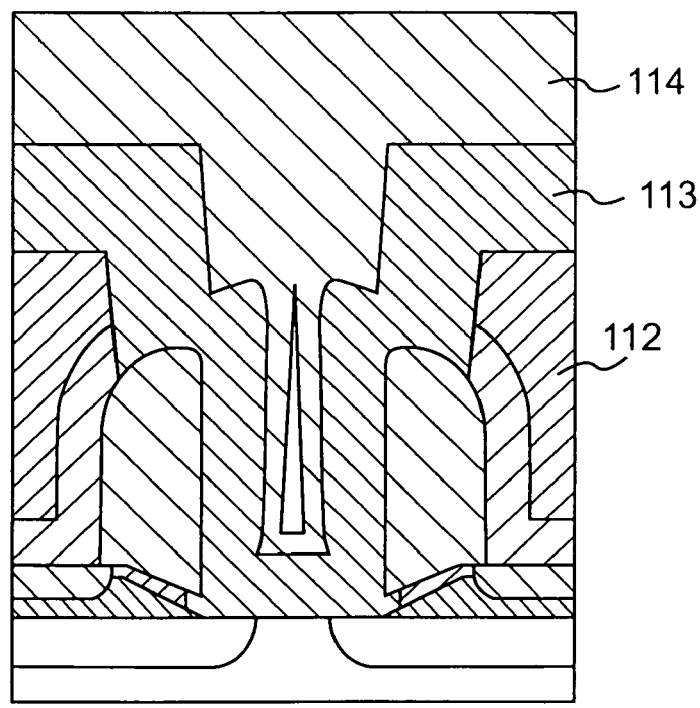

Then, a gate insulator film 113 of, e.g., $TiO_2$, $Al_2O_3$, tantalum oxide film, strontium titanate, barium titanate or lead zirconate titanate, having a thickness of 10 to 200 nm is deposited on the whole surface. Moreover, a gate electrode 114 of, e.g., a polycrystalline Si, an amorphous Si, TiNW, Pt, $RuO_2$ or $IrO_2$, having a thickness of 10 to 200 nm is deposited on the whole surface to obtain the shape of FIG. 13D. At this time, the interlayer insulator films 111 and 112 are formed of a silicon oxide film similar to the film 102, and further retreats when the etching of the film 102, so that the etching opening increases in the upper portion above the film 109. Therefore, this portion of the electrode 114 is wider than the bottom portion thereof, so that a so-called T-shaped gate is formed. This shape is a desired shape to decrease the resistance of the gate electrode and to hold a small capacitance between the gate electrode and the source/drain electrode. In order to form a good T-shape, it is desired that the width of the opening is formed so that the edge of the interlayer insulator film 111 remains on the side insulator film 109. In addition, when the uniformity of the gate insulator film 113 is not good, a shape wherein a part is narrower in the laminated upward direction as shown in FIG. 13D is obtained. If the gate electrode 114 is deposited in this state, void is formed in the lower portion of the gate electrode as shown in FIG. 13D.

Figure 13E:
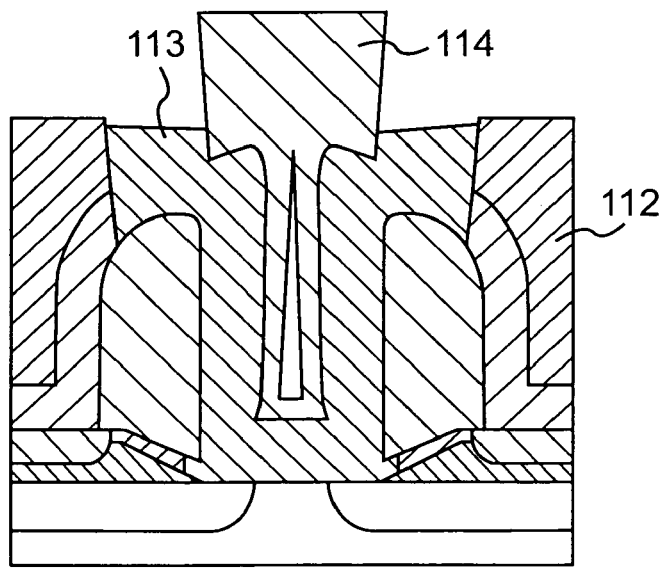

Then, etching is carried out by the chemical mechanical polishing method until the film 113 is exposed while the whole surface of the gate electrode 114 is planarized. Moreover, the whole surface of the film 113 is etched until the interlayer insulator film 112 is exposed, so that the shape of FIG. 13E is obtained. If the film 113 can be easily anisotropic-etched at the subsequent contact forming step, the step of removing the film 113 can be omitted.

Thereafter, after the interlayer insulator film 118 of, e.g., a silicon oxide film, BSG, PSG or BPSG, having a thickness of, e.g., 20 to 1000 nm, is deposited, a wiring contact 116 is formed by the lithography and the reactive ion etching. The contact 116 may have a depth so that the contact 116 reaches the gate electrode 114 or the source/drain conductive electrode 115, and the contact 116 may be embedded and formed by depositing or selectively growing, e.g., an polycrystalline silicon, into which Al, P or B is doped, WSi, TiSi, W, AlSi, AlSiCu, Cu or TiN. Moreover, a metal of a polycrystalline silicon, into which Al, P or B is doped, WSi, TiSi, AlSi, AlSiCu, Cu or W, having a thickness of 20 to 500 nm is deposited to form an upper wiring layer 117. Thus, the process is completed.

According to a method for producing the seventh preferred embodiment of a MIS transistor according to the present invention, since the impurity of the source/drain electrode is activated to form a silicide before the gate insulator film 113, it is not required to carry out a process for deteriorating the characteristics of the gate insulator film 113, such as a high temperature head process and hydrogen annealing, after forming the gate insulator film. Therefore, it is possible to achieve a process having high reliability.

Moreover, the width of the gate electrode facing the semiconductor region 105 is (width of dummy gate 101)+(thickness of insulator film 103)*2+(thickness of insulator film 108)*2−(side wall thickness of gate insulator 113)*2, so that it can be smaller than the width of the dummy gate 101. Therefore, it is possible to provide a smaller gate length than that in the lithography by adjusting the widths of the insulator film 103 and the insulator film 108.

This structure is shown in FIGS. 12A and 12B which are plan views of a unit MISFET and which show the positional relationship between the gate electrode 114, the source/drain region 110 and the channel region. In both drawings, reference number 119 denotes an element isolating film of, e.g., a LOCOS isolation or a trench isolation. These drawings also show the position of the contact 116 by circles, and suppose a case where one contact is formed in each of the gate, source and drain. The semiconductor region is sandwiched between two source/drain electrodes 110 and chain lines therebetween, and is a rectangular region surrounded by this and a solid line of the gate electrode 114. The boundary of a portion formed below the gate electrode 114 is shown by chain lines.

In FIG. 12A, the width of the lower portion of the gate electrode 114 shown by a dotted line is set to be constant on the semiconductor region surrounded by the element isolation 119. Thus, even if the alignment in the lithography of the gate electrode is shifted in vertical directions, it is possible to always obtain a constant gate length, so that the transistor characteristic can have resistance to a registration error. FIG. 12B shows a modified example of a pattern of the gate electrode, wherein a gate length (=a) on the boundary between the element isolation 119 and the semiconductor region is longer than a gate length (=b) in the semiconductor region. With respect to the gate insulator film 113 formed of a deposited film, the thickness deposited on the bottom of the groove increases as the width of the opening of the groove increases. Therefore, with the structure of FIG. 12B, the gate insulator film on the boundary between the element isolation 119 and the semiconductor region can be greater than the flat portion, so that it is possible to improve the dielectric breakdown voltage and leakage current characteristic of this portion. When the trench isolation is used as the element isolating film 119, if the element isolating film 119 is etched at, e.g., the step of etching the dummy gate electrode 102, to form the element isolating film 119 below the semiconductor region, the semiconductor region is convex toward the element isolating film 119 to cause the increase of electric field, so that there is a problem in that threshold deteriorates. Therefore, this problem can be solved by the structure of FIG. 12B.

Furthermore, the present invention should not be limited to the above described preferred embodiments. In the above described embodiments, the method for forming the insulator films 12, 111, 112, 113, 102, 103, 106, 108, 118 and 109 may be any one of an oxide film forming method using thermal oxidation, a method for forming an oxide film, into which oxygen is injected by a low acceleration energy of about 30 keV, a method for depositing an insulator film and a method for depositing a silicon nitride film, or a combination thereof. The method for forming the element isolating films and the insulator films themselves may be any one of other methods for converting silicon into a silicon oxide film or a silicon nitride film, e.g., a method for implanting oxygen ions into deposited silicon, or a method for oxidizing deposited silicon. Of course, this insulator film may be a silicon nitride film, a tantalum oxide film, a ferromagnetic film of strontium titanate, barium titanate or lead zirconate titanate, a monolayer film of a paraelectric film, or a composite film thereof.

In the embodiments, while the p-type Si substrate has been used as the semiconductor layer 7 and 105, the present invention should not be limited thereto, but an n-type Si substrate, an SOI substrate, a GaAs substrate or an InP substrate may be used. The present invention is not only applied to the n-type MISFET, but it may also be applied to a p-type MISFET. In this case, in the above described embodiments, n-type and p-type may be replaced with p-type and n-type, respectively, and the doped impurities, As, P and Sb, may be replaced with any one of In and B. In the case of ion implantation, As, P and Sb may be replaced with any one of In, B and $BF_2$.

The gate electrode 10, 114 and 6 may be formed of a mono-crystalline silicon, a polycrystalline silicon, a porous silicon, an amorphous silicon, a mixed crystal of SiGe, a mixed crystal of SiGeC, a metal or alloy, such as GaAs, W, Ta, Ti, Hf, Co, Pt and Pd, a silicide thereof, TaN, TiN, or a conductive nitride. The gate electrode 10, 114 and 6 may have a laminated structure thereof. Moreover, the present invention can be embodied in various ways without departing from the principle of the invention. The dummy gate 10 is preferably formed of SiGe or SiGeC so that a high etching selectivity to the source and drain regions 2 is kept during the removed process of the dummy gate 10.

According to the seventh preferred embodiment of a MIS transistor and a method for producing the same according to the present invention, since the inclined face is formed so as to extend from the top surface of the semiconductor layer serving as the source/drain region to the channel plane, it is possible to insure the distance from the lower end of the gate electrode, so that there is a peculiar advantage in that it is possible to hold a smaller capacitance between the gate and source and between the gate and drain.

In addition, the shape of the gate electrode is a T-shape, so that there are peculiar advantages in that it is possible to reduce the resistance of the gate electrode and it is possible to hold a small capacitance between the gate electrode and the source/drain electrode.

As described above, according to a MIS transistor and a method for producing the same according to the present invention, it is possible to reduce the resistance of the impurity diffusion layer constituting the source/drain, and it is also possible to reduce the parasitic capacitance of the gate, so that it is possible to considerably improve the switching speed of the transistor.

What is claimed is:

1. A method for producing a MIS transistor comprising a semiconductor substrate, impurity diffusion regions formed on the substrate serving as source/drain regions, and a gate electrode provided above a channel region between the source/drain regions, said method comprising:

selectively forming a first film on said semiconductor substrate;

etching said semiconductor substrate to form a first groove by using said first film as a mask;

forming a second film in said first groove and thereafter removing said first film;

diffusing an impurity onto a surface of said semiconductor substrate using said second film as a mask to form the impurity diffusion regions including a part thereof extending below the first groove;

forming an insulator film on said impurity diffusion regions and thereafter removing said second film to form a second groove on the semiconductor substrate so that a top surface of each of the impurity diffusion regions of the semiconductor substrate is higher than a bottom surface of the second groove;

forming a gate insulator film in said second groove and controlling a thickness of the gate insulator film so that a top surface of said gate insulator film is higher than the top surface of each of said impurity diffusion regions; and forming a gate electrode on the top surface of said gate insulator film.

2. A method for producing a MIS transistor according to claim 1, wherein said second film is a semiconductor film, and further comprising:

forming a sacrificial film in said first groove before forming said second film in said first groove; and removing said sacrificial film after removing said second film to form said second groove.

3. A method for producing a MIS transistor according to claim 1, further comprising:

polishing a surface of said second film by using said first film as a stopper.

4. A method for producing a MIS transistor according to claim 1, further comprising:

forming a protective film in said second groove before forming said gate insulator film in said second groove.

5. A method for producing a MIS transistor comprising a semiconductor substrate, impurity diffusion regions formed on the substrate serving as source/drain regions, and a gate electrode provided above a channel region between the source/drain regions, said method comprising:

selectively forming a first film on said semiconductor substrate;

etching said semiconductor substrate to form a first groove by using said first film as a mask;

forming a second film in said first groove and thereafter removing said first film;

diffusing an impurity onto a surface of said semiconductor substrate using said second film as a mask to form impurity diffusion regions including a part thereof extending below the first groove;

forming a first insulator film on said impurity diffusion regions and thereafter removing said second film to form a second groove on the semiconductor substrate so that a top surface of each of the impurity diffusion regions of the semiconductor substrate is higher than a bottom surface of the second groove;

forming a gate insulator film in said second groove and on said first insulator film;

polishing said gate insulator film by using said insulator film as a stopper and controlling a thickness of the gate insulator film so that a top surface of said gate insulator film is higher than a top surface of each of said impurity diffusion regions; and forming a gate electrode on the top surface of said gate insulator film.

6. A method for producing a MIS transistor according to claim 5, wherein said second film is a semiconductor film, and further comprising:

forming a sacrificial film in said first groove before forming said second film in said first groove; and removing said sacrificial film after removing said second film to form said second groove.

7. A method for producing a MIS transistor according to claim 5, further comprising:

polishing a surface of said second film by using said first film as a stopper.

8. A method for producing a MIS transistor according to claim 5, further comprising:

forming a protective film in said second groove before forming said gate insulator film in said second groove.

9. A method for producing a MIS transistor comprising a semiconductor substrate, impurity diffusion regions formed on the substrate serving as source/drain regions, and a gate electrode provided above a channel region between the source/drain regions, said method comprising:

selectively forming a first film on said semiconductor substrate;

diffusing an impurity onto a surface of said semiconductor substrate by using said first film as a mask to form the impurity diffusion regions, including an elevated impurity diffusion region elevated above the channel region;

forming an insulator film on said impurity diffusion regions so that a top surface of each of the impurity diffusion regions of the semiconductor substrate is higher than an upper level of the channel region;

removing said first film so as to form a groove on the semiconductor substrate;

forming a gate insulator film in said groove on the semiconductor substrate and controlling a thickness of the gate insulator film so that a top surface of said gate insulator film is higher than a top surface of each of said impurity diffusion regions; and forming a gate electrode on a top surface of said gate insulator film.

10. A method for producing a MIS transistor according to claim 9, further comprising:

elevating said elevated impurity diffusion region by an epitaxial growth technique before diffusing said impurity onto said surface of said semiconductor substrate.

11. A method for producing a MIS transistor according to claim 9, further comprising:

diffusing an impurity on said surface of said semiconductor substrate before elevating said elevated impurity diffusion region by an epitaxial growth technique.

12. A method for producing a MIS transistor according to claim 9, wherein said first film is semiconductor film and further comprising:

forming a sacrificial film on a surface of said first film; and removing said sacrificial film.

13. A method for producing a MIS transistor according to claim 9, further comprising:

forming a protective film in said groove before forming said gate insulator film in said groove.

14. A method for producing a MIS transistor comprising a semiconductor substrate, impurity diffusion regions formed on the substrate serving as source/drain regions, and a gate electrode provided above a channel region between the source/drain regions, said method comprising:

sequentially depositing on the semiconductor substrate a high dielectric film to serve as a gate insulator film and a polycrystalline semiconductor film to serve as a gate electrode, to form a laminate structure;

etching said laminate structure so as to form said gate electrode and thereafter forming side walls on sides of said gate electrode;

etching said high dielectric film so as to form said gate insulator film by using said gate electrode and side walls as a mask and forming a side wall insulator film at a side of said gate insulator film; and diffusing an impurity onto a surface of said semiconductor substrate to form the impurity diffusion regions including an elevated impurity diffusion region elevated from a channel region and controlling a thickness of the elevated impurity diffusion region by using said gate insulator film as a mask, so that a top surface of the gate insulator film is higher than a top surface of the elevated impurity diffusion region and that said top surface of the elevated impurity diffusion region is higher than a top surface of said channel region of the semiconductor substrate.

15. A method for producing a MIS transistor according to claim 14, further comprising:

elevating said elevated impurity diffusion region by an epitaxial growth technique before diffusing said impurity on said surface of said semiconductor substrate.

16. A method for producing a MIS transistor according to claim 14, further comprising:

diffusing an impurity on said surface of said semiconductor substrate before elevating said elevated impurity diffusion region by the epitaxial growth technique.

17. A method for producing a MIS transistor according to claim 14, further comprising:

forming a protective film on the semiconductor substrate before forming said gate insulator film on the semiconductor substrate.

18. A method for producing a MIS transistor comprising a semiconductor substrate, source/drain regions formed on the substrate, and a gate electrode provided above a channel region between the source/drain regions, said method comprising:

forming a dummy film on said channel region, which borders said source/drain regions;

selectively depositing semiconductor layers serving as said source/drain regions so that an inclined surface is formed between the top surface of said semiconductor layers and said channel region;

diffusing an impurity onto a surface of said semiconductor substrate to form impurity diffusion regions by using said dummy film as a mask and thereafter removing said dummy film;

depositing an insulator film on an exposed surface of said channel region to form a gate insulator film, which has a cross section of a grooved space at a center thereof; and depositing a gate electrode on a top of said gate insulator film to form a gate electrode having a cross section of a T shape.

* * * * *